US012575274B2

(12) United States Patent
Jeon et al.

(10) Patent No.: US 12,575,274 B2
(45) Date of Patent: Mar. 10, 2026

(54) ELECTRONIC DEVICE INCLUDING UNDER DISPLAY CAMERA

(71) Applicant: SAMSUNG ELECTRONICS CO., LTD., Suwon-si (KR)

(72) Inventors: Sangyong Jeon, Suwon-si (KR); Byungkwon Kang, Suwon-si (KR); Jaecheol Bae, Suwon-si (KR); Jeongyeol Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 630 days.

(21) Appl. No.: 17/986,576

(22) Filed: Nov. 14, 2022

(65) Prior Publication Data

US 2023/0157105 A1 May 18, 2023

Related U.S. Application Data

(63) Continuation of application No. PCT/KR2022/017902, filed on Nov. 14, 2022.

(30) Foreign Application Priority Data

Nov. 12, 2021 (KR) ........................ 10-2021-0155633

(51) Int. Cl.
*H10K 59/131* (2023.01)
*H10K 59/121* (2023.01)
(Continued)

(52) U.S. Cl.
CPC ......... *H10K 59/131* (2023.02); *H10K 59/121* (2023.02); *G02B 7/021* (2013.01); *H10K 59/65* (2023.02)

(58) Field of Classification Search
CPC .... H10K 59/131; H10K 59/65; H10K 59/121; G02B 7/021
(Continued)

(56) References Cited

U.S. PATENT DOCUMENTS

2005/0083307 A1    4/2005  Aufderheide et al.
2015/0022222 A1    1/2015  Takao et al.
(Continued)

FOREIGN PATENT DOCUMENTS

CN        110189627 A      8/2019
CN        110649074 A  *   1/2020    .............. G09F 9/33
(Continued)

OTHER PUBLICATIONS

English translation of CN 110649074 A (Year: 2020).*
(Continued)

*Primary Examiner* — James R Greece
*Assistant Examiner* — Hana S Featherly
(74) *Attorney, Agent, or Firm* — Sughrue Mion, PLLC

(57) ABSTRACT

An electronic device includes an optical lens module; and a display including a pixel layer and a wiring layer, wherein the pixel layer may include: a first area corresponding to an angle of view of the optical lens module; and a second area around the first area, and wherein the wiring layer may include: a transparent wire having a first refractive index; a first material provided adjacent to the transparent wire and having a second refractive index; and a second material having a third refractive index, wherein the first material is disposed on the second material or the second material is disposed on the first material.

19 Claims, 17 Drawing Sheets

(51) Int. Cl.
　　*G02B 7/02*　　　　(2021.01)
　　*H10K 59/65*　　　(2023.01)
(58) Field of Classification Search
　　USPC ......................................................... 313/503
　　See application file for complete search history.

(56)　　　　　　　References Cited

U.S. PATENT DOCUMENTS

| | | |
|---|---|---|
| 2016/0099296 A1 | 4/2016 | Jeon et al. |
| 2016/0231482 A1 | 8/2016 | Hasegawa et al. |
| 2018/0090699 A1* | 3/2018 | Shin ..................... H10K 59/353 |
| 2020/0319682 A1 | 10/2020 | Moon et al. |
| 2021/0013298 A1 | 1/2021 | Her et al. |
| 2021/0091147 A1 | 3/2021 | Liu et al. |
| 2021/0118909 A1* | 4/2021 | Hsieh ................. H10D 86/0212 |
| 2021/0136264 A1 | 5/2021 | Kim et al. |
| 2021/0151425 A1 | 5/2021 | Kim et al. |
| 2021/0191552 A1 | 6/2021 | Bok et al. |
| 2021/0202622 A1 | 7/2021 | Kim et al. |
| 2022/0368785 A1 | 11/2022 | Aoki et al. |

FOREIGN PATENT DOCUMENTS

| | | | |
|---|---|---|---|
| CN | 112071890 A | 12/2020 | |
| JP | 2007-508639 A | 4/2007 | |
| JP | 2007-235751 A | 9/2007 | |
| JP | 2008-124365 A | 5/2008 | |
| JP | 2009-53893 A | 3/2009 | |
| JP | 2013-107214 A | 6/2013 | |
| JP | 2021-118487 A | 8/2021 | |
| KR | 10-2016-0039745 A | 4/2016 | |
| KR | 10-2020-0117137 A | 10/2020 | |
| KR | 10-2021-0060186 A | 5/2021 | |
| KR | 10-2021-0082316 A | 7/2021 | |
| WO | WO-2020020186 A1 * | 1/2020 | ............. H04N 23/57 |
| WO | 2020/231445 A1 | 11/2020 | |

OTHER PUBLICATIONS

International Search Report dated Feb. 22, 2023, issued by the International Searching Authority in International Application No. PCT/KR2022/017902 (PCT/ISA/210).

Written Opinion dated Feb. 22, 2023, issued by the International Searching Authority in International Application No. PCT/KR2022/017902 (PCT/ISA/237).

Communication issued Nov. 11, 2025 by the Korean Intellectual Office in Korean Patent Application No. 10-2021-0155633.

\* cited by examiner

ELECTRONIC DEVICE INCLUDING UNDER DISPLAY CAMERA

CROSS-REFERENCE TO RELATED APPLICATIONS

This application is a by-pass continuation application of International Application No. PCT/KR2022/017902, filed on Nov. 14, 2022, which is based on and claims priority to Korean Patent Application No. 10-2021-0155633, filed on Nov. 12, 2021, in the Korean Intellectual Property Office, the disclosures of which are incorporated by reference herein in their entireties.

BACKGROUND

1. Field

Various embodiments of the disclosure relate to an electronic device including an under display camera (UDC).

2. Description of Related Art

Typically, an electronic device may perform a specific function according to a program provided therein (e.g., an electronic scheduler, a portable multimedia reproducer, a mobile communication terminal, a tablet PC, an image/sound device, a desktop/laptop PC, or a vehicle navigation system), as well as a home appliance. The above-mentioned electronic devices may output, for example, information stored therein as sound or an image. As the degree of integration of electronic devices has increased and ultra-high-speed and large-capacity wireless communication has become popular, multiple functions have recently come to be provided in a single electronic device, such as a mobile communication terminal. For example, various functions, such as an entertainment function (e.g., a game function), a multimedia function (e.g., a music/video reproducing function), a communication and security function for mobile banking, a schedule management function, or an e-wallet function, are integrated in a single electronic device, in addition to a communication function. Such an electronic device is being miniaturized so that a user is able to conveniently carry the electronic device.

Optical lens modules (or optical devices) such as a camera capable of capturing images or moving pictures have been widely used. Conventionally, film-based optical lens modules were mainly used. In recent years, digital cameras or video cameras having a solid-state image sensor such as a charge-coupled device (CCD) or a complementary metal-oxide semiconductor (CMOS) have been widely distributed. Optical lens modules, which adopt a solid-state image sensor (a CCD or a CMOS), are replacing film-based optical lens modules due to easy image storage and reproduction as well as easy movement compared to the film-based optical lens modules. In order to acquire high-quality images and/or moving pictures, an optical lens module may include a plurality of lenses. An optical lens module including a combination of multiple lenses (e.g., a lens assembly) may have, for example, a lower F number and less aberration, thereby enabling high-quality (high-resolution) images and/or moving pictures to be acquired. In order to obtain a lower F number and less aberration, for example, in order to obtain a high-resolution and bright image, a large number of lenses may be required. Optical lens modules have generally been used in electronic devices specialized for photographing, such as digital cameras, but are also mounted in miniaturized electronic devices such as portable wireless terminals, notebook PCs, tablet PCs, and smartwatches. The above-described optical lens modules have recently become essential components of electronic devices that provide various services and additional functions. A high-performance optical lens module may have an effect of attracting a user to purchase an electronic device.

In spite of the trend of miniaturization of electronic devices for user convenience, specifications of optical lens modules mounted on electronic devices are becoming higher. As the specifications of the optical lens modules are becoming higher, the number of lenses included in an optical lens module may further increase. In addition, types of optical lens modules mounted on an electronic device may also be varied. For example, as well as optical lens modules having various angles of view such as wide, ultra-wide, and telephoto lens modules, optical lens modules capable of recognizing a fingerprint or iris or extracting depth information are also being adopted. When a lens assembly including a plurality of lenses, an optical lens module including such a lens assembly, and/or the above-mentioned various types of optical lens modules are adopted in an electronic device, the number of camera holes may increase. Due to the increased number of camera holes, the aesthetic appearance of the electronic device may be deteriorated. In addition, when a camera hole is disposed in a display area of the front surface portion of an electronic device, the corresponding display area may be invaded. Accordingly, in recent years, an under display camera (UDC) technology has been adopted as a method for preventing a reduction of a display area and/or deterioration of appearance due to the presence of a camera hole.

In an under display camera (UDC) technology, at least one optical lens module may be disposed under an active area of a display. In an electronic device to which the UDC technology is applied, an area corresponding to the angle of view of the optical lens module in the active area of the display may include a transmissive area in which pixels and wires are disposed in a density lower than that in a periphery in order to satisfy a transmittance required by the optical lens module as well as to conduct a display function. However, diffraction having various frequencies may occur when light is transmitted through the transmissive area. Light sources having various frequencies generate a constructive and/or destructive interference due to diffraction with adjacent light sources, which may result in deterioration of quality of an image output from the optical lens module.

SUMMARY

Various embodiments of the disclosure are able to provide an electronic device to which a UDC technology is applied and which is capable of improving quality of an image output from an optical lens module by adjusting the diffraction characteristic of light flowing into a transmissive area of the electronic device.

According to an aspect of the disclosure, an electronic device may include: an optical lens module; and a display including a pixel layer and a wiring layer, wherein the pixel layer may include: a first area corresponding to an angle of view of the optical lens module; and a second area around the first area, and wherein the wiring layer may include: a transparent wire having a first refractive index; a first material provided adjacent to the transparent wire and having a second refractive index; and a second material having a third refractive index, wherein the first material is disposed on the second material or the second material is disposed on the first material.

According to an aspect of the disclosure, an electronic device includes: an optical lens module; a display including a first area corresponding to an angle of view of the optical lens module and a second area around the first area, wherein the first area may include a first plurality of pixels provided at a first interval, and the second area may include a second plurality of pixels provided at a second interval that is smaller than the first interval; and a wiring layer including a plurality of transparent wires are arranged side by side, wherein the optical lens module is provided under an active area of the display, and wherein each transparent wire of the plurality of transparent wires may include irregularities having a predetermined thickness on at least one side of the transparent wire facing other adjacent transparent wires among the plurality of transparent wires.

According to various embodiments of the disclosure, it is possible to reduce the effect of diffraction of light by applying transparent wires to a display having a UDC structure.

In addition, by reducing a difference in refractive index between materials (e.g., the first material and the second material) disposed adjacent to the transparent wires, it is possible to minimize an optical path difference (OPD) between the transparent wires and the materials. As a result, it is possible to reduce the occurrence of flare.

In addition, according to various embodiments of the disclosure, when the transparent wires are applied to the display of the UDC structure, by applying hemispherical irregularities to the surfaces of the transparent wires, it is possible to scatter light to reduce the occurrence of flare.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
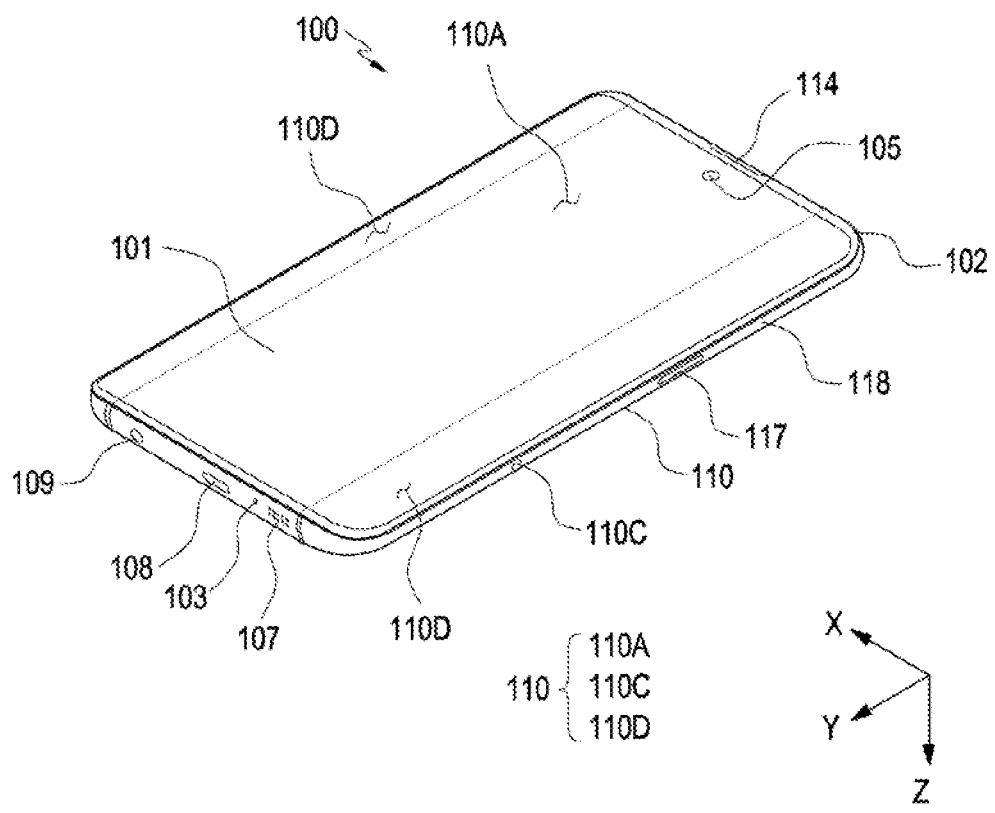
FIG. 1 is a front-side perspective view illustrating an electronic device according to various embodiments of the disclosure.

Embodiments of the disclosure are provided to more fully describe the disclosure to those skilled in the art. The following embodiments may be modified in many different forms and the scope of the disclosure is not limited to the embodiments set forth below; rather, these embodiments are provided to make the disclosure more thorough and complete and fully convey the idea of the disclosure to those skilled in the art.

In the following drawings, the thickness or size of each layer is exaggerated or reduced for the convenience and clarity of description, and like or similar reference numerals denote like or similar elements in the drawings. As used herein, the term "and/or" includes any and all combinations of corresponding items enumerated.

Figure 2:
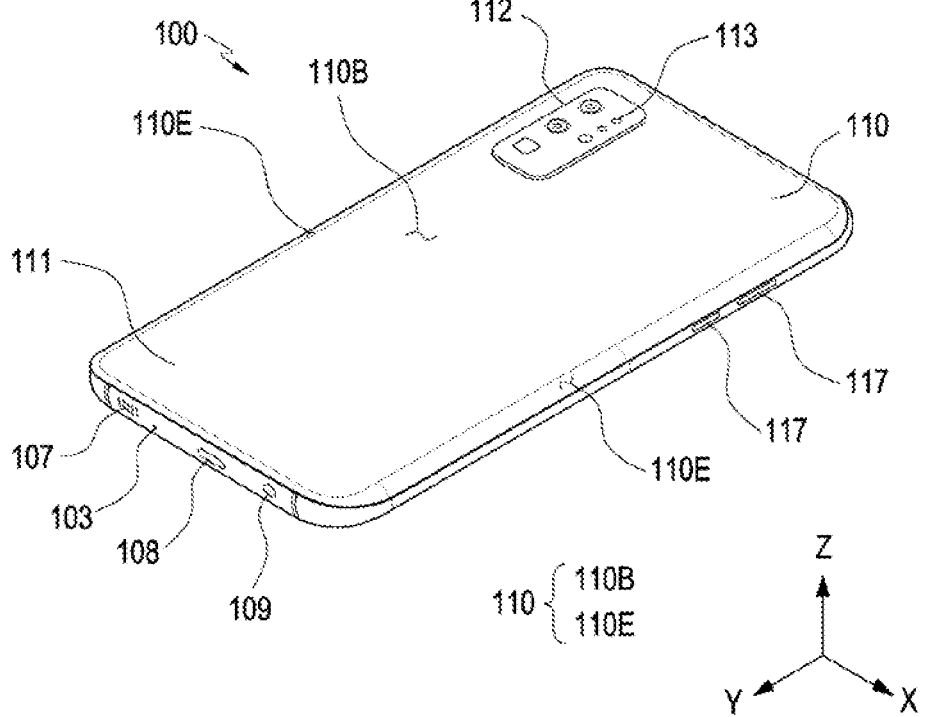
FIG. 2 is a rear-side perspective view illustrating the electronic device according to various embodiments of the disclosure.

FIG. 1 is a front-side perspective view illustrating an electronic device 100 according to various embodiments. FIG. 2 is a rear-side perspective view illustrating the electronic device 100 according to various embodiments.

Referring to FIGS. 1 and 2, the electronic device 100 according to an embodiment may include a housing 110 including a front surface 110A, a rear surface 110B, and a side surface 110C surrounding a space between the front surface 110A and the rear surface 110B. In an embodiment, the housing 110 may refer to a structure defining a part of the front surface 110A in FIG. 1, the rear surface 110B, and the side surface 110C in FIG. 2. According an embodiment, at least a portion of the front surface 110A may be defined by a substantially transparent front plate 102 (e.g., a glass plate or a polymer plate including various coating layers). The rear surface 110B may be defined by a rear plate 111. The rear plate 111 may be formed of, for example, glass, ceramic, polymer, metal (e.g., aluminum, stainless steel (STS), or magnesium), or a combination of two or more of these materials. The side surface 110C may be defined by a side bezel structure 118 (or a "side member") coupled to the front plate 102 and the rear plate 111 and including a metal and/or a polymer. In some embodiments, the rear plate 111 and the side bezel structure 118 may be integrally configured with each other, and may include the same material (e.g., glass, a metal material such as aluminum, or ceramic).

In the illustrated embodiment, the front plate 102 may include, at the opposite ends of long edges thereof, two first edge areas 110D, which are bent from the front surface 110A toward the rear plate 111 and extend seamlessly. In an embodiment (see, for example, FIG. 2), the rear plate 111 may include, at the opposite ends of long edges thereof, two second edge areas 110E, which are bent from the rear surface 110B toward the front plate 102 and extend seamlessly. In some embodiments, the front plate 102 (or the rear plate 111) may include only one of the first edge areas 110D (or the second edge areas 110E). In some embodiments, some of the first edge areas 110D or the second edge areas 110E may not be included. In the embodiments described above, when viewed from a side of the electronic device 100, the side bezel structure 118 may have a first thickness (or width) on the side surface portions that do not include the first edge areas 110D or the second edge areas 110E described above, and may have a second thickness, which is smaller than the first thickness, on the side surface portions that include the first edge areas 110D or the second edge areas 110E.

According to an embodiment, the electronic device 100 may include at least one of a display panel 101, audio modules 103, 107, and 114, a sensor module, camera modules 105, 112, and 113, key input devices 117, and connector holes 108 and 109. In some embodiments, in the electronic device 100, at least one of the components (e.g., the connector hole 109) may be omitted, or other components may be additionally included.

According to an embodiment, the display panel 101 (e.g., a display) may be visually exposed through a substantial portion of, for example, the front plate 102. In some embodiments, at least a portion of the display panel 101 may be exposed through the front plate 102 defining the front surface 110A and the first edge areas 110D. In some embodiments, the edges of the display panel 101 may be configured to be substantially the same as the shape of the periphery of the front plate 102 adjacent thereto. In an embodiment, the distance between the periphery of the display panel 101 and the periphery of the front plate 102 may be substantially constant in order to increase the exposed area of the display panel 101.

According to an embodiment, the surface (or the front plate 102) of the housing 110 may include a screen display area provided since the display panel 101 is visually exposed. For example, the screen display area may include the front surface 110A and the first edge areas 110D.

In an embodiment, a portion of the screen display area (e.g., the front surface 110A and the first edge areas 110D) of the display panel 101 may be provided with a recess or an opening and may include at least one of an audio module 114, a sensor module, a light-emitting element, and a camera module 105, which are aligned with the recess or the opening. In an embodiment, the rear surface of the screen display area of the display panel 101 may include at least one of an audio module 114, a sensor module, a camera module 305, a fingerprint sensor, and a light-emitting element.

In an embodiment, the display panel 101 may be coupled to or disposed adjacent to a touch-sensitive circuit, a pressure sensor capable of measuring a touch intensity (pressure), and/or a digitizer configured to detect a magnetic field-type stylus pen.

In some embodiments, at least some of the key input devices 117 may be disposed in the first edge areas 110D and/or the second edge areas 110E.

According to an embodiment, the audio modules 103, 107, and 114 may include, for example, a microphone hole 103 and speaker holes 107 and 114. The microphone hole 103 may include a microphone disposed therein to acquire external sound, and in some embodiments, a plurality of microphones may be disposed therein to be able to detect the direction of sound. The speaker holes 107 and 114 may include an external speaker hole 107 and a call receiver hole 114. In some embodiments, the speaker holes 107 and 114 and the microphone hole 103 may be implemented as a single hole, or a speaker may be included without the speaker holes 107 and 114 (e.g., a piezo speaker). The audio modules 103, 107, and 114 are not limited to the above-described structure, and various design changes may be made, such as mounting only some audio modules or adding a new audio module, depending on the structure of the electronic device 100.

According to an embodiment, sensor modules may generate an electrical signal or a data value corresponding to, for example, an internal operating state of the electronic device 100 or an external environmental state. The sensor modules may include, for example, a first sensor module (e.g., a proximity sensor) and/or a second sensor module (e.g., a fingerprint sensor) disposed on the front surface 110A of the housing 110, and/or a third sensor module (e.g., an HRM sensor) and/or a fourth sensor module (e.g., a fingerprint sensor) disposed on the rear surface 110B of the housing 110. In some embodiments, the fingerprint sensor may be disposed not only on the front surface 110A (e.g., the display panel 101) of the housing 110, but also on the rear surface 110B. The electronic device 100 may further include at least one of sensor modules, such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor. The sensor modules are not limited to the above-described structure, and various design changes such as mounting only some of the sensor modules and adding new sensor modules may be made depending on the structure of the electronic device 100.

According to an embodiment, the camera modules 105, 112, and 113 may include, for example, a front camera module 105 disposed on the front surface 110A of the electronic device 100, a rear camera module 112 disposed on the rear surface 110B, and/or a flash 113. The camera modules 105 and 112 may include one or more lenses, an image sensor, and/or an image signal processor. The flash 113 may include, for example, a light-emitting diode or a xenon lamp. In some embodiments, two or more lenses (e.g., an infrared camera, a wide-angle lens, and a telephoto lens), and image sensors may be disposed on one surface of the electronic device 100. The camera modules 105, 112, and 113 are not limited to the above-described structure, and various design changes such as mounting only some of the camera modules and adding new camera modules may be made depending on the structure of the electronic device 100.

According to an embodiment, the electronic device 100 may include a plurality of camera modules (e.g., a dual camera or a triple camera) having different properties (e.g., angles of view) or functions, respectively. For example, a plurality of camera modules 105 and 112 including lenses having different angles of view may be configured, and the electronic device 100 may control the change of the angles of view of the camera modules 105 and 112 executed therein based on a user's selection. For example, at least one of the plurality of camera modules 105 and 112 may be a wide-angle camera, and at least one of other camera modules may be a telephoto camera. Similarly, at least one of the plurality of camera modules 105 and 112 may be a front camera, and at least one of other camera modules may be a rear camera. In addition, the plurality of camera modules 105 and 112 may include at least one of a wide-angle camera, a telephoto camera, or an infrared (IR) camera (e.g., a time-of-flight (TOF) camera, or a structured light camera). According to an embodiment, the IR camera may be operated as at least a part of a sensor module. For example, the TOF camera may be operated as at least a part of a sensor module for detecting a distance to a subject.

According to an embodiment, the key input device 117 may be disposed on the side surface 110C of the housing 110. In an embodiment, the electronic device 100 may not include some or all of the above-mentioned key input devices 117, and a key input device 117, which is not included in the above-mentioned key input devices, may be implemented in another type, such as a soft key, on the display panel 101. In some embodiments, a key input device may include a sensor module disposed on the rear surface 110B of the housing 110.

According to an embodiment, the light-emitting element may be disposed on, for example, the front surface 110A of the housing 110. The light-emitting element may provide, for example, information about the state of the electronic device 100 in an optical form. In an embodiment, the light-emitting element may provide a light source that is interlocked with, for example, the operation of the front camera module 105. The light-emitting element may include, for example, an LED, an IR LED, and/or a xenon lamp.

According to an embodiment, the connector holes 108 and 109 may include, for example, a first connector hole 108 capable of accommodating a connector (e.g., a USB connector) for transmitting/receiving power and/or data to/from an external electronic device, and/or a second connector hole 109 capable of accommodating a connector (e.g., an earphone jack) for transmitting/receiving an audio signal to/from an external electronic device. The connector holes 108 and 109 are not limited to the above-described structure, and various design changes such as providing only some of the connector holes and adding new connector holes may be made depending on the structure of the electronic device 100.

In FIG. 1 and subsequent figures, a spatial coordinate system defined by the X axis, the Y axis, and the Z axis orthogonal to each other is illustrated. Here, the X axis may represent the width direction of the electronic device 100, the Y axis may represent the longitudinal direction of the electronic device 100, and the Z axis may represent the height direction of the electronic device 100.

The electronic device according to various embodiments of the disclosure has a bar-type or plate-type appearance, but embodiments of the disclosure are not limited thereto. For example, the illustrated electronic device may be a part of a rollable electronic device, a slidable electronic device, or a foldable electronic device.

Hereinafter, an electronic device including an under display camera (hereinafter, referred to as a "UDC" for short) according to various embodiments of the disclosure will be described in detail with reference to FIGS. 3 to 13B.

In the following description, the front plate 102 may be referred to as a "window member 102", and the camera modules 105, 112, and 113 may be referred to as an "optical lens module 105". In describing the optical lens module 105, a description is made with reference to the front camera module 105 of FIG. 1, but this is for convenience of description. It shall be noted that the description may also be applicable mutatis mutandis to the description of the rear camera modules 112 and 113.

Figure 3:
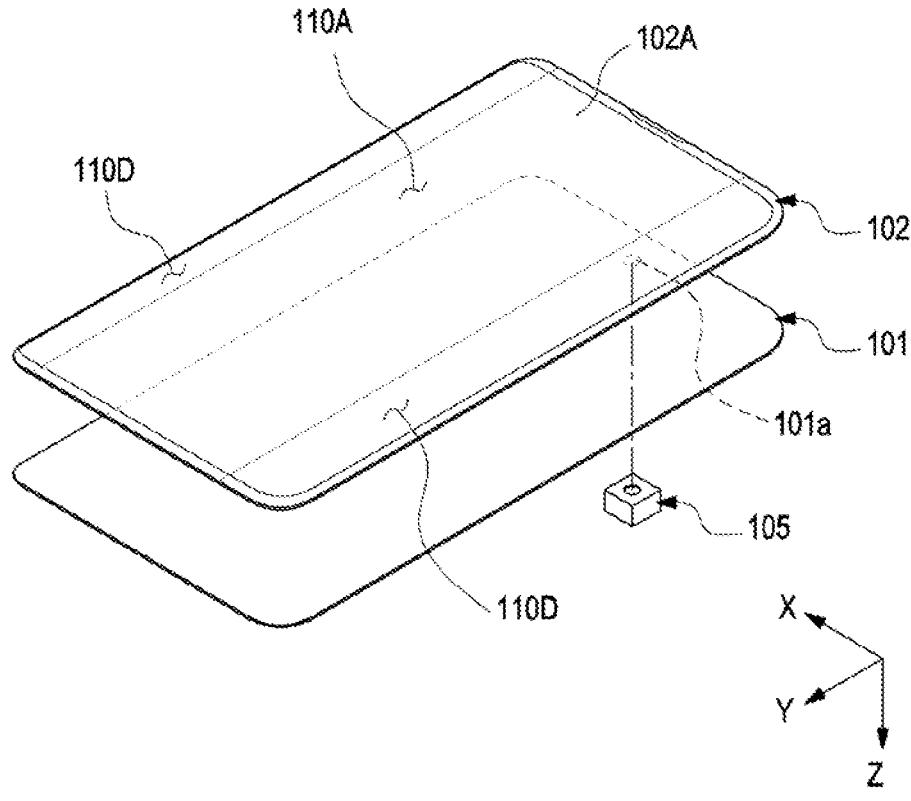
FIG. 3 is an exploded perspective view of a window member, a display panel, and an optical lens module according to various embodiments of the disclosure.

FIG. 3 is an exploded perspective view of a window member 102, a display panel 101, and an optical lens module 105 according to various embodiments of the disclosure.

According to an embodiment, at least a portion of the window member 102 may be made of a substantially transparent material. For example, at least a portion of the window member 102 may be formed of a glass plate or a polymer plate including various coating layers. According to an embodiment, the display panel 101 may be exposed through a substantial portion of the window member 102 so that a screen displayed on the display is visually recognizable from the outside.

According to various embodiments, a polarization layer may be further included between the window member 102 and the display panel 101. The polarization layer may allow only light of a specific wavelength to pass therethrough from the screen displayed on the display panel 101 or the amount of light incident on the display panel 101.

According to an embodiment, an optical lens module 105 and/or a sensor module may be disposed in the inner space of the electronic device 100 to be exposed to the external environment through a predetermined area of the display panel 101 and the window member 102. For example, the predetermined area may be an area in the display panel 101 in which the number of pixels is smaller than that of other areas adjacent to the predetermined area. According to an embodiment, when viewed from above the display 101, at least a portion of the predetermined area may overlap the optical lens module 105 and/or the sensor module. Here, when it is described that the optical lens module 105 overlaps at least a portion of the predetermined area, it may mean that the angle of view of the optical lens module 105 corresponds to the predetermined area. In an embodiment, some sensor modules may be arranged in the inner space of the electronic device to implement the functions thereof without being visually exposed through the window member 102.

According to an embodiment, the display panel 101 may include a camera hole 101a. According to an embodiment, the camera hole 101a may be provided in a predetermined area having a smaller number of pixels than other adjacent areas. According to various embodiments, the camera hole 101a may be configured as a physically empty portion, such as a cavity, a groove, and a recess, without being filled with any component. However, embodiments of the disclosure are not limited thereto, and may only refer to a predetermined area in which the number of pixels is smaller than that of the surrounding area. In an electronic device including a UDC, the camera hole 101a may be configured to be difficult to be visually distinguished from other adjacent areas. The camera hole 101a may have a predetermined diameter and may be provided at a position corresponding to the lens assembly included in the optical lens module 105. According to an embodiment, when the electronic device 100 is manufactured, optical axes of the opening 101a provided in the display panel 101 and the lens assembly of the optical lens module 105 may be aligned with each other in the process of assembling individual components.

Figure 4:
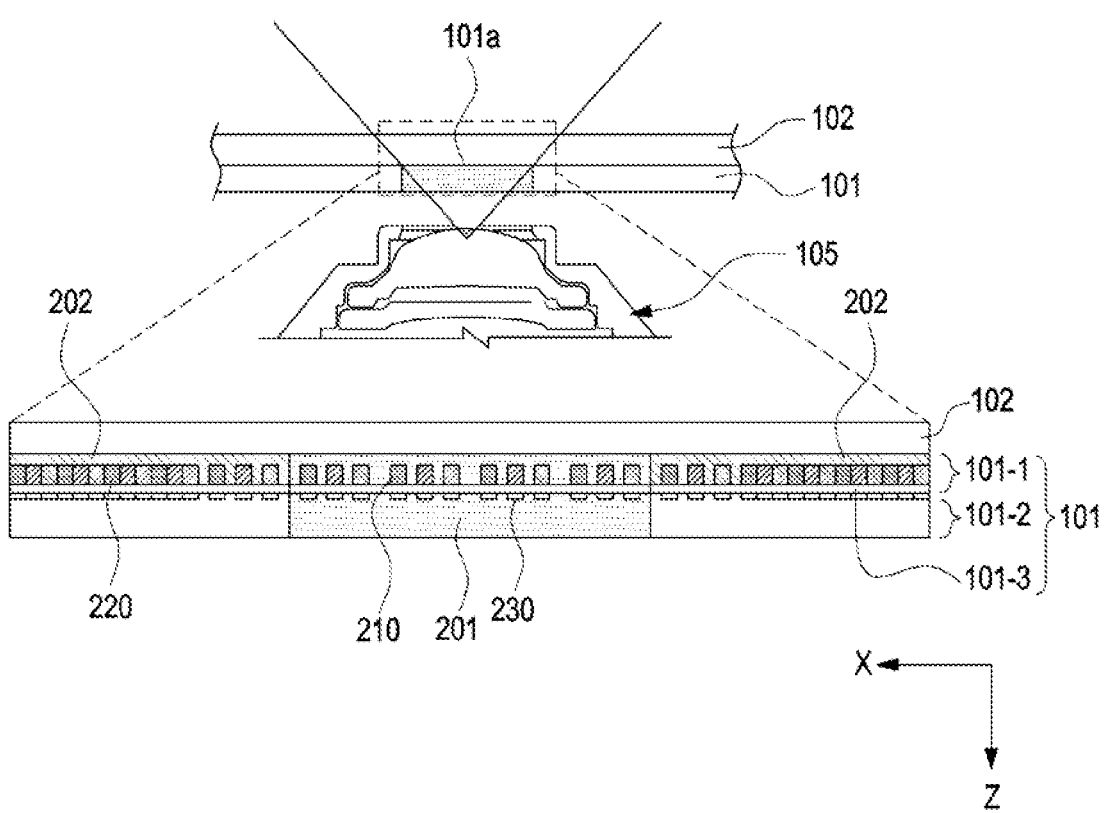
FIG. 4 is a cross-sectional view of the window member, the display panel, and the optical lens module according to the embodiment illustrated in FIG. 3.

FIG. 4 is a cross-sectional view of the window member 102, the display panel 101, and the optical lens module 105 according to the embodiment illustrated in FIG. 3.

Referring to FIG. 4, the window member 102 may be disposed on the outermost portion of the electronic device, and the display panel 101 may be disposed on the rear surface of the window member. When the window member 102 and the display panel 101 are enlarged, the display panel 101 may be stacked on the rear surface of the window member 102. The display panel 101 may include a liquid crystal display (LCD) or an organic light emitted diode (OLED) display, and may additionally be configured in the form of a touch sensitive panel (TSP). According to an embodiment, the display panel 101 may include a plurality of pixels 210 and 220 as display elements, and a plurality of wires 230 provided to correspond to the plurality of pixels 210 and 220. In addition, an insulating layer may be included between the plurality of pixels 210 and 220. According to another embodiment, the display panel 101 may include a display driver integrated circuit (not illustrated). According to an embodiment, the window member 102 and the display panel 101 may be at least partially configured in a curved shape. The display panel 101 may be formed of a flexible polymer film, and may include, for example, polyimide, polyethylene terephthalate, or other polymer materials.

According to an embodiment, the optical lens module 105 may be disposed under the display panel 101. As illustrated in FIG. 3, the optical lens module 105 may be a UDC in which at least a portion of a camera lens is disposed under an active area of the display panel 101. The optical lens module 105 may include an image sensor that detects, via a lens, light incident through the window member 102 and the display panel 101, converts the light into a digital signal to acquire an image, and at least one of an image processing module for processing an image or a memory for storing an image.

According to various embodiments of the disclosure, the display panel 101 may include a pixel layer 101-1 and a wiring layer 101-2 that include a first area 201 corresponding to the angle of view of the optical lens module 105 and a second area 202 disposed around the first area 201. Here, the first area 201 may correspond to a predetermined area on the display panel 101 described above with reference to FIG. 3. In addition, the first area 201 may be a light-transmissive area provided to allow light to reach the optical lens module 105. According to various embodiments, both the first area 201 and the second area 202 may correspond to an active area of the display panel 101. A plurality of pixels may be disposed in the pixel layer 101-1 of the first area 201 and the second area 202. According to example embodiments, the plurality of pixels disposed in the pixel layer 101-1 may be encapsulated. Here, a plurality of reference colors (e.g., red (R), green (G), and blue (B)) may be allocated to each of the plurality of pixels. The plurality of pixels may be arranged in a matrix form on the pixel layer 101-1, and an image data (e.g., RGB) signal may be transmitted to each of the plurality of pixels by using a driving circuit included in the electronic device 100 to display an image.

According to an embodiment of the disclosure, the plurality of pixels 220 disposed in the second area 202 may be disposed at a smaller interval than the plurality of pixels 210 disposed in the first area 201. For example, as illustrated in FIG. 4, the plurality of pixels 210 disposed in the first area 201 may be disposed at a first interval, and the plurality of pixels 220 disposed in the second area 202 may be disposed at a second interval, wherein the first interval may be larger than the second interval. Here, the "first interval" means an average interval of the plurality of pixels 210 disposed in the first area 201, and the "second interval" means an average interval of the plurality of pixels 220 disposed in the second area 202. According to an embodiment, assuming that the area occupied by the plurality of pixels 220 per unit area of the display panel in the second area 202 is 100%, the area occupied by the plurality of pixels 210 per unit area of the display panel in the first area 201 may be 30% or less.

According to an embodiment, assuming that the pixels are disposed at the same interval, the size of each pixel included in the plurality of pixels 210 disposed in the first area 201 may be smaller than the size of each pixel included in the plurality of pixels 220 disposed in the second area 202.

According to an embodiment, by reducing the number of pixels 210 disposed in the first area 201 of the electronic device 100 compared to other areas (e.g., the second area

202), it is possible to enhance the light transmittance of the first area 201, which may make it possible to implement a UDC technology. In the electronic device 100 according to various embodiments, since the density of pixels per unit area of the display panel in the first area 201 is lower than the density of pixels per unit area of the display panel in the second area 202, a compensation driving circuit for compensating for a decrease in luminance may be additionally provided (or disposed) in at least a portion of the first area 201 in which the density of pixels is low.

The wiring layer 101-2 is an element included in the display panel 101 together with the pixel layer 101-1, wherein the wiring layer 101-2 may include a driving circuit that transmits an image data (e.g., RGB) signal to each of the plurality of pixels in order to display an image via the pixel layer 101-1 of the display panel 101. According to an embodiment, the wiring layer 101-2 may include a driving circuit and an insulating material surrounding the driving circuit. For example, the driving circuit may include a data driver that transmits an image data signal to each pixel via a data line connected to each pixel and a gate driver (or a scan driver) that transmits a signal for activating each pixel to display an image according to the data signal to each pixel via a gate line connected to each pixel. The driving circuit provided in each pixel may include at least one switch (e.g., a thin film transistor (TFT)), at least one capacitor (e.g., a storage capacitor (CST)), a light-emitting element (e.g., an organic light-emitting diode), and the like. The at least one TFT may charge the capacitor with a data voltage supplied from the data line in response to a scan signal supplied from the gate line. At least one TFT may control the amount of current supplied to the organic light-emitting diode according to the data voltage charged in the capacitor. Although the organic light-emitting diode display has been described as an example with respect to pixels in the above-described embodiments, embodiments of the disclosure are not limited thereto, and a driving circuit and a display improvement structure according to various embodiments may also be used in various display devices.

According to various embodiments, a plurality of wires may be provided in the wiring layer 101-2 at positions corresponding to the first area 201. In addition, the plurality of wires may correspond to data lines and/or gate lines. Here, the data lines and the gate lines may cross each other, and pixels may be disposed at positions where the data lines and the gate lines cross each other. According to various embodiments, the plurality of pixels and the plurality of wires may at least partially overlap each other on the first area 201, and light that has passed through the plurality of pixels of the first area 201 may be incident into the optical lens module 105 via the plurality of wires.

According to various embodiments of the disclosure, the plurality of wires on the wiring layer 101-2 may be configured as transparent wires 230. By configuring the plurality of wires as transparent wires 230, it is possible to improve the transmittance of light incident into the optical lens module 105. Here, the transparent wires 230 may include an indium tin oxide (ITO) material. However, even when the plurality of wires on the wiring layer 101-2 are configured as the transparent wires 230, diffraction having various frequencies may occur when light passes through the pixels and the transparent wires. This causes a phenomenon in which, since various frequencies are input, a modulation transfer function (MTF) for each frequency is not formed linearly through a constructive and/or destructive interference due to the diffraction of a light source, and the MTF for each frequency fluctuates as a sine wave due to the diffraction of the light source (a phenomenon in which the MTF value generally decreases as the frequency increases). In order to prevent this phenomenon and improve image quality, various embodiments of the disclosure are described below for adjusting the diffraction characteristic of light entering from a transmissive area (the first area 201).

Figure 5:
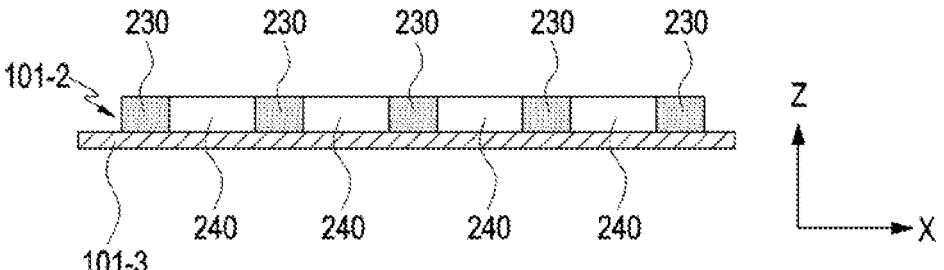
FIG. 5 is a cross-sectional view of a wiring layer according to an embodiment of the disclosure.

FIG. 5 is a cross-sectional view of a wiring layer 101-2 according to an embodiment of the disclosure.

According to various embodiments, the wiring layer may include transparent wires 230 and a first material 240. For example, the transparent wires 230 may be formed of a conductive material, while the first material 240 may be formed of a non-conductive material. According to an embodiment, the transparent wires 230 and the first material 240 may be provided in the wiring layer 101-2 corresponding to a transmissive area (the first area 201) in the wiring layer 101-2 included in the display panel 101. The transparent wires 230 may be provided on one surface of an insulating layer 101-3, and as described above with reference to FIG. 4, the transparent wires 230 may be provided on the opposite side to the plurality of pixels 210 with the insulating layer 101-3 interposed therebetween. A plurality of transparent wires 230 may be provided, and each of the plurality of transparent wires 230 may be provided to at least partially overlap the plurality of pixels 210. For example, as illustrated in FIG. 5, the plurality of transparent wires 230 may be provided to at least partially overlap the plurality of pixels 210 in a first direction (e.g., the Z-axis direction).

According to various embodiments, the first material 240 may be provided to be in contact the transparent wires 230. For example, in the case where the plurality of transparent wires 230 are spaced apart from each other by a predetermined distance as illustrated in FIG. 5, the first material 240 may be provided to fill the spaces between the transparent wires 230. According to various embodiments, the transparent wires 230 may have a shape elongated in a second direction (e.g., the Y-axis direction in FIG. 3) perpendicular to the first direction (e.g., the Z-axis direction), wherein the first material 240 may also have a shape elongated in the second direction (e.g., the Y-axis direction in FIG. 3) perpendicular to the first direction (e.g., the Z-axis direction). In addition, the first material 240 may be provided to be parallel with the transparent wires in a third direction (e.g., the X-axis direction) perpendicular to the first direction (e.g., the Z-axis direction) and the second direction (e.g., the Y-axis direction in FIG. 3). According to various embodiments, the plurality of transparent wires 230 and a plurality of first material portions 240 may be alternately disposed in the third direction (e.g., the X-axis direction). In the above-described various embodiments, the first material portions 240 and the transparent wires 230 may have the same height as each other in the first direction (the Z-axis direction).

According to various embodiments, when the transparent wires 230 have a first refractive index, the first material 240 may have a second refractive index. According to an embodiment, the second refractive index of the first material 240 may be determined to have a predetermined difference from the first refractive index of the transparent wires 230. According to an embodiment, the second refractive index of the first material 240 may be determined to have a difference of less than 2% with respect to the first refractive index of the transparent wires 230. For example, when the first refractive index of the transparent wires 230 is about 1.9, the second refractive index of the first material 240 may be about 2. In this case, the transparent wires 230 may include an indium tin oxide (ITO) material, and the first material 240 may be silicon nitride ($SiN_x$). By disposing the first material 240 having a small refractive index difference with respect to the transparent wires 230 adjacent to the transparent wires 230, it is possible to minimize an optical path difference between light beams passing through the first transmissive area (the first area 201). Accordingly, it is possible to reduce the deterioration of the quality of the image output from the optical lens module by reducing an optical interference due to the optical path difference.

Figure 6A:
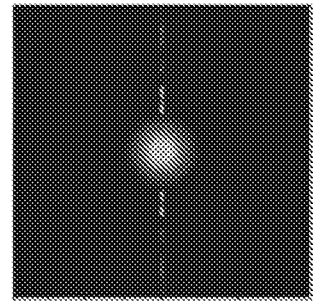
FIGS. 6A to 6C are view representing various simulation results based on the embodiment illustrated in FIG. 5.
Figure 6B:
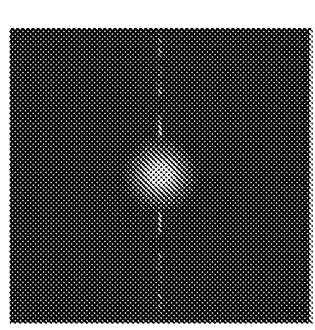
Figure 6C:
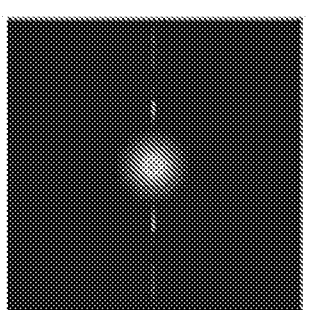

FIGS. 6A to 6C are views representing various camera flare simulation results performed based on the embodiment illustrated in FIG. 5.

FIGS. 6A to 6C may represent the shapes of images formed on an image sensor by light that passes through a transmissive area (e.g., the first area 201) in the state in which the window member 102 and the display panel 101 are positioned in this order from the object side and the optical lens module 105 having an angle of view corresponding to the transmissive area (the first area 201) of the display panel 101 is disposed.

Assuming the first refractive index of the transparent wires 230 is n(A) and the second refractive index of the first material 240 is n(B), according to a first embodiment, the first refractive index and the second refractive index for each wavelength of light passing through the transmissive area (the first area 201) may be as represented in Table 1 below.

TABLE 1

| | 656 nm | 588 nm | 546 nm | 486 nm | 435 nm |
|---|---|---|---|---|---|
| n(A) | 1.765 | 1.827 | 1.868 | 1.928 | 1.987 |
| n(B) | 1.810 | 1.860 | 1.867 | 1.890 | 1.940 |
| Absolute value of refractive index difference \|n(A) − n(B)\| | 0.045 | 0.033 | 0.001 | 0.038 | 0.047 |

FIG. 6A may represent a camera flare phenomenon of, for example, a light wavelength in a visible light band (e.g., 435 nm to 656 nm) when the first material having a refractive index n(B) as in [Table 1] was applied according to a first embodiment. The portion where blur occurs in a substantially circular shape from the center of FIG. 6A may be a pixel (e.g., an anode), and the line portion extending up and down from the center of FIG. 6A may represent a transparent wire 230. In addition, assuming the first refractive index of the transparent wires 230 is n(A) and the second refractive index of the first material 240 is n(B), according to a second embodiment, the first refractive index and the second refractive index for each wavelength of light passing through the transmissive area (the first area 201) may be as represented in Table 2 below.

TABLE 2

| | 656 nm | 588 nm | 546 nm | 486 nm | 435 nm |
|---|---|---|---|---|---|
| n(A) | 1.765 | 1.827 | 1.868 | 1.928 | 1.987 |
| n(B) | 1.765 | 1.810 | 1.830 | 1.880 | 1.910 |
| Absolute value of refractive index difference \|n(A) − n(B)\| | 0.000 | 0.017 | 0.038 | 0.048 | 0.077 |

In the second embodiment, first material 240, the type of which is different from that in the first embodiment with respect to transparent wires 230, which are the same as those in the first embodiment, may have been used. FIG. 6B may represent a flare phenomenon of, for example, a light wavelength in a visible light band (e.g., 435 nm to 656 nm)

when the first material having a refractive index n(B) as in [Table 2] were applied according to the second embodiment.

In addition, assuming the first refractive index of the transparent wires 230 is n(A) and the second refractive index of the first material 240 is n(B), according to a third embodiment, the first refractive index and the second refractive index for each wavelength of light passing through the transmissive area (the first area 201) may be as represented in Table 3 below.

TABLE 3

|  | 656 nm | 588 nm | 546 nm | 486 nm | 435 nm |
|---|---|---|---|---|---|
| n(A) | 1.765 | 1.827 | 1.868 | 1.928 | 1.987 |
| n(B) | 1.830 | 1.880 | 1.910 | 1.950 | 1.990 |
| Absolute value of refractive index difference |n(A) − n(B)| | 0.065 | 0.053 | 0.042 | 0.022 | 0.003 |

In the third embodiment, first material 240 the type of which is different from those of the first and second embodiments may have been used with respect to transparent wires 230 which are the same as the transparent wires 230 used in the first and second embodiments. FIG. 6C may represent a flare phenomenon of, for example, a light wavelength in a visible light band (e.g., 435 nm to 656 nm) when the first material having a refractive index n(B) as in [Table 3] was applied according to the third embodiment.

Referring to Tables 1 to 3, depending on what type of first material is used as the first material 240 adjacent to the transparent wires 230, the simulation results related to the camera flare may also be derived in various ways.

In addition, referring to Tables 1 to 3, the refractive index of a medium is formed differently for each wavelength (or each frequency) of light, and accordingly, even when a specific type of first material 240 is applied, the intensity of the camera flare depends on the wavelength of the light. Thus, it may be difficult to completely control the flare phenomenon only with the display structure including the transparent wires 230 and the first material 240.

A display further including a second material 250 in addition to the transparent wires 230 and the first material 240 and an electronic device including the display will be described in detail with reference to FIG. 7 and subsequent drawings. As will be described later in detail, the camera flare phenomenon described above with reference to FIGS. 5 to 6c may be effectively reduced and/or controlled in the display according to the embodiment of FIG. 7 and an electronic device including the same.

Figure 7:
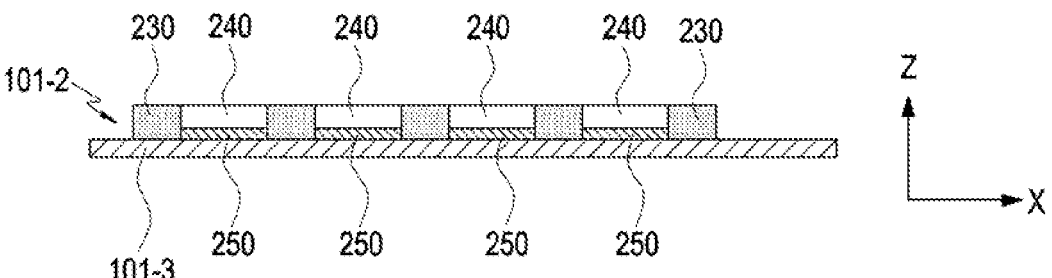
FIG. 7 is a cross-sectional view of a wiring layer according to an embodiment of the disclosure.

FIG. 7 is a cross-sectional view of a wiring layer 101-2 according to an embodiment of the disclosure.

According to various embodiments, the wiring layer 101-2 may include the transparent wires 230, a first material 240, and a second material 250. For example, the transparent wires 230 may be formed of a conductive material, while the first material 240 and the second material 250 may be formed of a non-conductive material. According to an embodiment, the transparent wires 230, the first material 240, and the second material 250 may be provided in a wiring layer corresponding to a transmissive area (the first area 201) in the wiring layer 101-2 included in the display panel 101.

According to various embodiments, the first material 240 and the second material 250 may be provided to be in contact with the transparent wires 230 together. For example, as illustrated in FIG. 7, when a plurality of transparent wires 230 are disposed to be spaced apart from each other by a predetermined distance, the first material 240 and the second material 250 may be provided to fill the spaces between the transparent wires 230. According to various embodiments, the transparent wires 230 may have a shape elongated in a second direction (e.g., the Y-axis direction in FIG. 3) perpendicular to the first direction (e.g., the Z-axis direction), wherein the first material 240 and the second material 250 may also have a shape elongated in the second direction (e.g., the Y-axis direction in FIG. 3) perpendicular to the first direction (e.g., the Z-axis direction). In addition, the first material 240 and the second material 250 may be provided to be parallel with the transparent wires in a third direction (e.g., the X-axis direction) perpendicular to the first direction (e.g., the Z-axis direction) and the second direction (e.g., the Y-axis direction in FIG. 3). According to various embodiments, the plurality of transparent wires 230 and the plurality of first material portions 240 may be alternately disposed in the third direction (e.g., the X-axis direction). In addition, the plurality of second material portions 250 may also be alternately disposed in the third direction (e.g., the X-axis direction).

The second material 250 may be laminated or stacked with the first material 240 in the first direction (e.g., the Z-axis direction). For example, as the first material 240 is disposed on the second material 250 in the first direction (e.g., the Z-axis direction), the second material 250 may not be visually recognized from the outside. However, it should be noted that embodiments are not limited to this arrangement example. As long as the first material 240 and the second material 250 can be laminated or stacked on each other in the first direction (e.g., the Z-axis direction), as illustrated in FIG. 7, the first material 240 may be disposed on the second material 250 in the first direction (e.g., the Z-axis direction). Alternatively, the second material 250 may be disposed on the first material 240 unlike the arrangement illustrated in the drawing.

According to various embodiments, when the transparent wires 230 are configured to have a first refractive index, the first material 240 may be configured to have a second refractive index and the second material 250 may be configured to have a third refractive index. According to an embodiment, the second refractive index of the first material 240 may have a predetermined difference from the first refractive index of the transparent wires 230. The third refractive index of the second material 250 may also have a predetermined difference from the first refractive index of the transparent wires 230. For example, when the first refractive index is about 1.9, the second refractive index may be about 2, and the third refractive index may be about 1. Compared to the embodiment illustrated in FIG. 5, in the embodiment illustrated in FIG. 7, since the second material 250 is further included in addition to the first material 240, the light passing through the transmissive area (the first area 201) may pass through the first material 240 and the second material 250 together. Accordingly, according to various embodiments of the disclosure, in consideration of the fact that light sequentially passes through the first material 240 after passing through the second material 250 (or passes through the second material 250 after passing through the first material 240), the first material 240 and the second material 250, which allow light pass therethrough to have a smaller optical path difference with respect to light passing through the transparent wires 230, may be selected. Examples of the refractive indices of the transparent wires 230, the first material 240, and the second material 250 are not limited to the aforementioned numerical values and may be set in various ways.

In selecting a material, which allow light passing therethrough to have a small optical path difference with respect to light passing through the transparent wires 230, in the embodiment illustrated in FIG. 5, since only the first material 240 is selected, it may be difficult to find the first material 240 having a refractive index within a predetermined difference relative to the refractive index of the transparent wires 230. Furthermore, even if a material has a refractive index within a predetermined difference from the refractive index of the transparent wires 230, it may be difficult to apply the material to a product in consideration of whether the material is processed or not, durability of the material, and the like. In contrast, in the embodiment illustrated in FIG. 7, since it is possible to select the second material 250 as well as the first material 240, finding a combination of the first material 240 and the second material 250 that has a refractive index within a predetermined difference from the refractive index of the transparent wires 230 and the application of the materials to a product may be easy compared to the above-described embodiment. In addition, when the first material 240 and the second material 250 are combined, the difference in refractive index relative to the transparent wires 230 is reduced compared to the case where only the first material 240 is used, so that it is possible to output an image of good quality via the optical lens module compared to the case where only the first material 240 is used. According to an embodiment, in laminating or stacking the first material 240 and the second material 250, each of the height of the first material 240 and the height of the second material 250 may be appropriately adjusted. With respect to the first material 240 and the second material 250, not only the parameters for the refractive indices but also the parameters for the heights may be considered. Thus, it is possible to significantly increase the range of material selection.

The wiring layer including the transparent wires 230, the first material 240, and the second material 250 may be required to satisfy Conditional Expression 1 below.

$$-0.045 \leq (N(A)*T(A)-N(B)*T(B)-N(B')*T(B'))/(T(A)+T(B)+T(B')) \leq 0.045 \quad \text{[CONDITIONAL EXPRESSION 1]}$$

Here, N(A) may correspond to the first refractive index of the transparent wires 230, N(B) may correspond to the second refractive index of the first material 240, N(B') may correspond to the third refractive index of the second material 250, T(A) may correspond to the thickness of the transparent wires 230, T(B) may correspond to the thickness of the first material 240, and T(B') may correspond to the thickness of the second material 250. Conditional Expression 1 above may be satisfied in a light wavelength band of 435 nm to 656 nm. According to various embodiments of the disclosure, when the wiring layer satisfies Conditional Expression 1 described above, the optical path difference between the light passing through the transparent wires 230 and the light passing through both of the first material 240 and the second material 250 is minimized. Thus, it is possible to output an image having high resolution via the optical lens module.

In the above-described various embodiments, the structure in which the first material 240 and the second material 250 are laminated or stacked on each other may have the same height as the transparent wires 230 in the first direction (e.g., the Z-axis direction). That is, the wiring layer including the transparent wires 230, the first material 240, and the second material 250 may be required to satisfy Conditional Expression 2 below.

$$T(A)=T(B)+T(B') \quad \text{[CONDITIONAL EXPRESSION 2]}$$

Here, as in Conditional Expression 1 above, T(A) may correspond to the thickness of the transparent wires 230, T(B) may correspond to the thickness of the first material 240, and T(B') may correspond to the thickness of the second material 250.

Figure 8A:
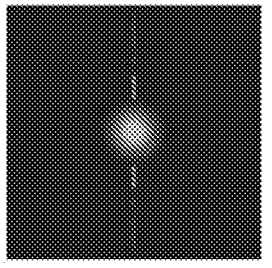
FIGS. 8A to 8C are view representing various simulation results based on the embodiment illustrated in FIG. 7.
Figure 8B:
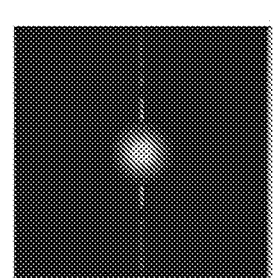
Figure 8C:
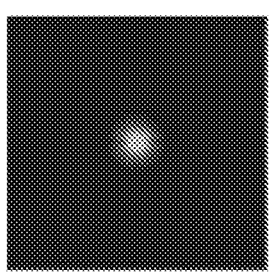

FIGS. 8A to 8C are views representing various simulation results performed based on the embodiment illustrated in FIG. 7.

FIGS. 8A to 8C may represent the shapes of images formed on an image sensor by light that passes through the transmissive area (e.g., the first area 201) in the state in which the window member 102 and the display panel 101 are positioned from the object side and the optical lens module 105 having an angle of view corresponding to the transmissive area (the first area 201) of the display panel 101 is disposed.

Assuming that the first refractive index of the transparent wires 230 is N(A), the second refractive index of the first material 240 is N(B), the third refractive index of the second material 250 is N(B'), the thickness of the transparent wires 230 is T(A), the thickness of the first material 240 is T(B), and the thickness of the second material 250 is T(B'), a drawing obtained when $(N(A)*T(A)-N(B)*T(B)-N(B')*T(B'))/(T(A)+T(B)+T(B'))=-0.045$ in the state in which both Conditional Expression 1 and Condition Expression 2 are satisfied is illustrated in FIG. 8A.

In addition, a drawing obtained when $(N(A)*T(A)-N(B)*T(B)-N(B')*T(B'))/(T(A)+T(B)+T(B'))=0.045$ in the state that both Conditional Expression 1 and Conditional Expression 2 are satisfied is illustrated in FIG. 8B.

In addition, a drawing obtained when $(N(A)*T(A)-N(B)*T(B)-N(B')*T(B'))/(T(A)+T(B)+T(B'))=0$ in the state that both Conditional Expression 1 and Conditional Expression 2 are satisfied is illustrated in FIG. 8C.

According to the simulation results illustrated in FIG. 8A, it was confirmed that when the value of $(N(A)*T(A)-N(B)*T(B)-N(B')*T(B'))/(T(A)+T(B)+T(B'))$ is less than −0.045, camera flare occurs remarkably, and it was confirmed when the value of $(N(A)*T(A)-N(B)*T(B)-N(B')*T(B'))/(T(A)+T(B)+T(B'))$ is greater than or equal to −0.045, it was confirmed that camera flare gradually decreases. According to the simulation results illustrated in FIG. 8B, it was confirmed that when the value of $(N(A)*T(A)-N(B)*T(B)-N(B')*T(B'))/(T(A)+T(B)+T(B'))$ is greater than 0.045, camera flare occurs remarkably, and it was confirmed when the value of $(N(A)*T(A)-N(B)*T(B)-N(B')*T(B'))/(T(A)+T(B)+T(B'))$ is less than or equal to 0.045, it was confirmed that camera flare gradually decreases. That is, for example, when parameters related to the refractive indices, thicknesses of the transparent wires 230, the first material 240, and the second material 250 do not satisfy Conditional Expression 1 above and the value of $(N(A)*T(A)-N(B)*T(B)-N(B')*T(B'))/(T(A)+T(B)+T(B'))$ exceeds the upper limit of 0.045 or falls below the lower limit of −0.045, camera flare may excessively occur.

In addition, as represented in the simulation results illustrated in FIG. 8C, when the value of $(N(A)*T(A)-N(B)*T(B)-N(B')*T(B'))/(T(A)+T(B)+T(B'))=0$, it is possible to confirm that no camera flare occurs.

For example, when Conditional Expression 1 above is applied to the wiring layers including transparent wires 230 made of indium tin oxide (ITO) having a first refractive index of 1.922 and a thickness of 0.3 mm, a first material 240 which is $Si_3N_4$ having a refractive index of 2.033 and a thickness of 0.25 mm, and a second material 250 which is air having a refractive index of 1 and a thickness of 0.05 mm, $(N(A)*T(A)-N(B)*T(B)-N(B')*T(B'))/(T(A)+T(B)+T(B'))$ may have a value of 0.03058, which is a value within the critical range. A UDC including the wiring layers having these physical dimensions may provide an optical path difference at which an acceptable level of camera flare occurs. As another example, when Conditional Expression 1 above is applied to the wiring layers including transparent wires 230 made of indium tin oxide (ITO) having a first refractive index of 1.922 and a thickness of 0.3 mm, a first material 240 which is $Si_3N_4$ having a second refractive index of 2.033 and a thickness of 0.25 mm, and a second material 250 which is $SiO_2$ having a refractive index of 1.46 and a thickness of 0.05 mm, (N(A)*T(A)–N(B)*T(B)–N(B')*T (B'))/(T(A)+T(B)+T(B')) may have a value of –0.00775, which is a value within the critical range. Comparing the calculated values according to Conditional Expression 1, when other conditions are the same, a UDC to which $SiO_2$ is applied as the second material 250 may provide an optical path difference at which smaller camera flare occurs compared to that in a UDC to which air is applied as the second material 250.

As described above, according to various embodiments of the disclosure, by providing transparent wires 230 to a display and providing a first material 240 and a second material 250 adjacent to the transparent wires 230, it is possible to reduce the optical path difference of light passing through the light-transmissive area. In a display including transparent wires 230, a first material 240, and a second material 250, and an electronic device including the display, it is easy to reduce or control camera flare by appropriately combining the refractive indices of respective components, and as a result, it is possible to output an image with high resolution.

Figure 9:
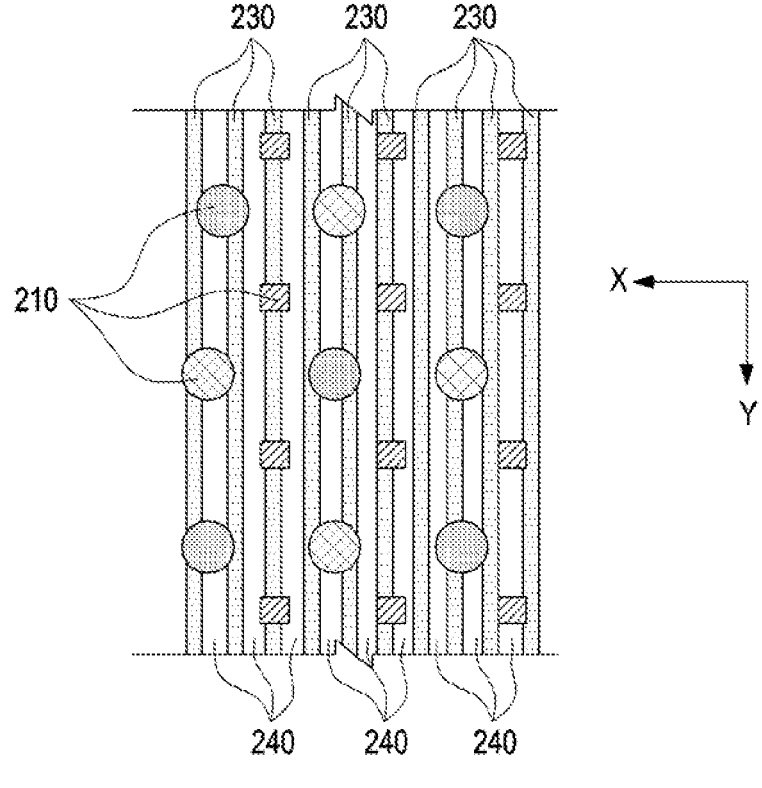
FIG. 9 is a top view of a display according to various embodiments of the disclosure.

FIG. 9 is a top view of a display according to various embodiments of the disclosure.

According to various embodiments, the transparent wires 230 included in the wiring layer may have a shape that is elongated in a second direction (e.g., the Y direction) in a state of at least partially overlapping pixels 210.

In the above-described embodiments, methods of reducing an optical path difference of light passing through a transmissive area (the first area 201) by providing transparent wires 230 and a first material 240 adjacent thereto, and by further providing a second material 250 according to an embodiment have been described.

Hereinafter, in an embodiment of the disclosure, another method for improving the quality of an image output from an optical lens module 105 may be provided by changing the surface structure of the above-described transparent wires 230. For example, in an embodiment to be described below, a method for reducing flare visible with naked eyes may be provided through a method of scattering light by forming irregularities on the surfaces of the transparent wires 230. The embodiments described below may be conducted independently of the above-described embodiments (the embodiments in which the first material 240 and the second material 250 are added) or may be implemented as an embodiment in which the surface structures of the transparent wires 230 are additionally applied based on the above-described embodiments (the embodiments in which the first material 240 and the second material 250 are added).

Figure 10A:
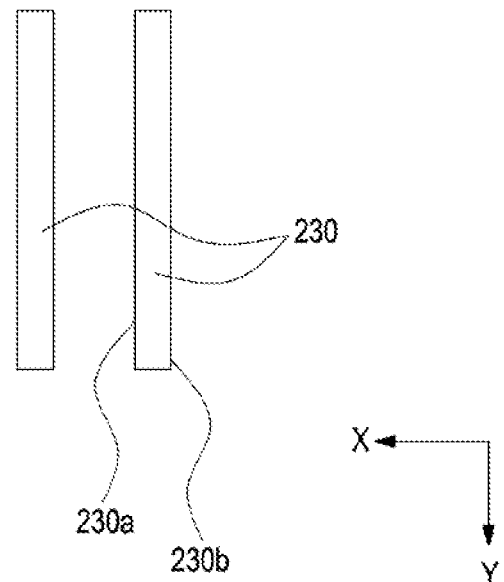
FIG. 10A is a view illustrating transparent wires according to an embodiment of the disclosure.
Figure 10B:
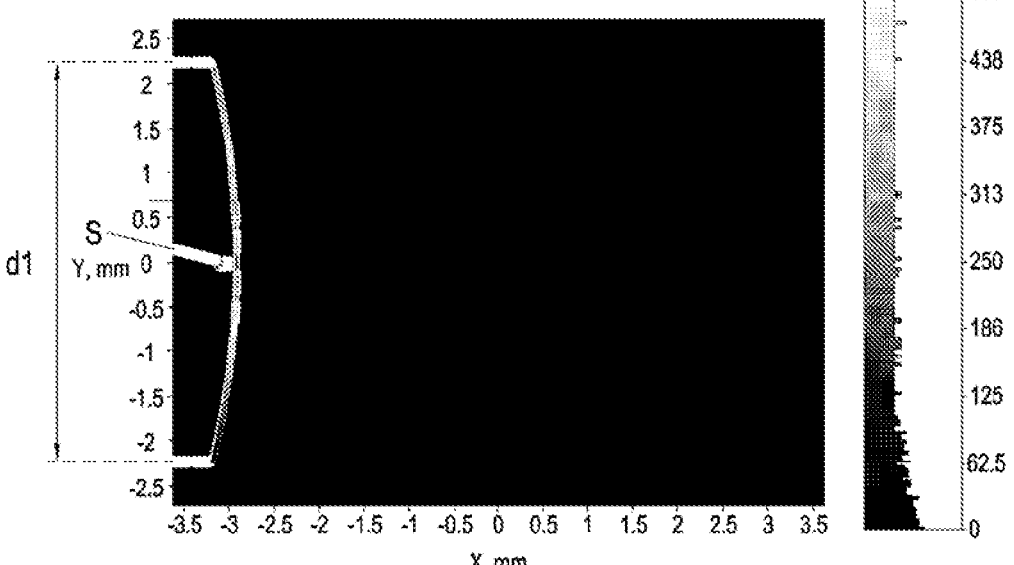
FIG. 10B is a view representing a photon irradiance of the embodiment of FIG. 10A.

FIG. 10A is a view illustrating transparent wires 230 according to an embodiment of the disclosure. FIG. 10B is a view representing a photon irradiance of the embodiment of FIG. 10A.

Referring to FIG. 10A, the surfaces of the transparent wires 230 according to an embodiment may be configured in a flat shape as illustrated in the drawing. Here, the surfaces of the transparent wires 230 refer to the surfaces 230a oriented in a third direction (e.g., the X-axis direction) perpendicular to the second direction (e.g., the Y-axis direction) in which the transparent wires 230 are elongated or the surfaces oriented in a direction opposite to the third direction.

FIG. 10B may represent a simulation result of measuring the amount of physical energy of light (photon irradiance). FIG. 10B may represent a photon irradiance when light passing through a transmissive area (e.g., the transmissive area 201 in FIG. 4) in which the transparent wires 230 are disposed is imaged on an image sensor. FIGS. 6A to 6C and FIGS. 8A to 8C represent simulation results when light is incident to be perpendicular to a UDC (or parallel to the optical axis connecting the centers and focuses of the lenses in an optical system arranged in a line), but FIG. 10B may represent a simulation result when light is obliquely incident on a UDC.

The left side of FIG. 10B may represent an image sample acquired by an image sensor, and the histogram indicated on the right side may represent the energy level of light imaged on the image sensor. When light spreads radially from the center (S) of a light source (e.g., a light-emitting element, that is, a pixel) by using an image sample, the sum of the moving distance of light in the +Y-axis direction and the moving distance of light in the –Y-axis direction may be measured. In addition, it is possible to identify the light spreading distance from the center S of the light source by using the sum of the measured moving distances of light. It may be interpreted that as the absolute value of the moving distance of light increases, the flare visually recognized by naked eyes is large, and as the absolute value of the moving distance of light is small, the flare visually recognized by naked eyes is small. In addition, the intensity (strength) of light may be expressed as a gradation as represented in 10B, and may also expressed as a histogram having various energy level distributions as represented in FIG. 10B.

For example, according to the embodiment illustrated in FIGS. 10A and 10B, the sum of the moving distances of light may be measured as d1, and the energy level may be measured to have a distribution ranging from the lowest energy level value of 0 to the highest energy level value of 500. This may mean that light passing through a transmissive area (the first area 201) in which the transparent wires 230 having flat surfaces are provided may spread by a considerable distance from the center of the light source S and has a significant energy level. When light spreads and has an energy as described above, flare may be observed.

Figure 11A:
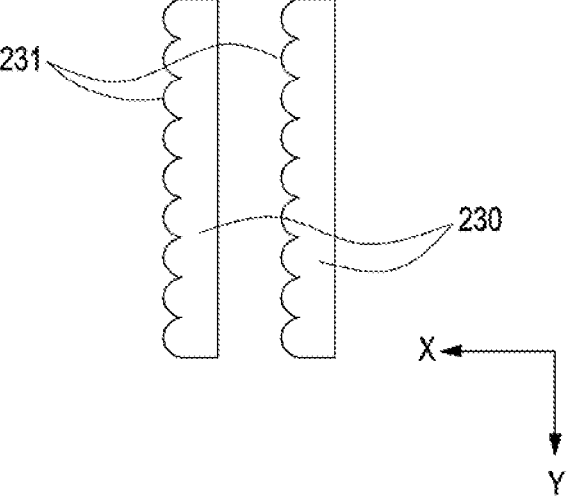
FIG. 11A is a view illustrating transparent wires according to an embodiment of the disclosure.
Figure 11B:
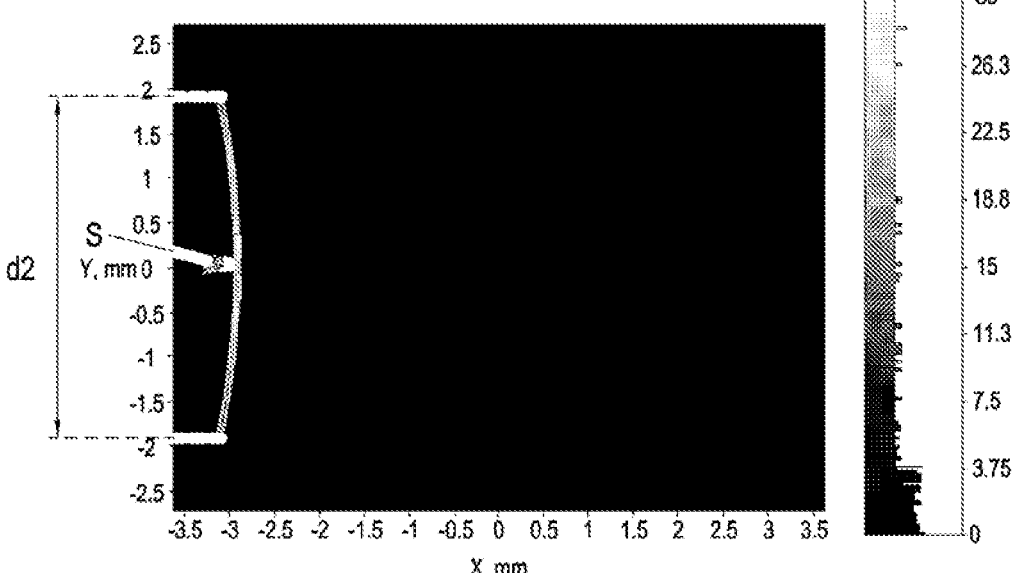
FIG. 11B is a view representing a photon irradiance of the embodiment of FIG. 11A.

FIG. 11A is a view illustrating transparent wires 230 according to an embodiment of the disclosure. FIG. 11B is a view representing a photon irradiance of the embodiment of FIG. 11A.

Referring to FIG. 11A, the transparent wires 230 according to an embodiment may each have irregularities 231 on one surface (e.g., the surface 230a oriented in the third direction (X direction)) as illustrated in the drawing. FIGS. 11A and 11B represent that the hemispherical irregularities 231 (e.g., hemispherical protrusions) are formed on one surface of the surface of each transparent wire 230.

According to the embodiment illustrated in FIGS. 11A and 11B, the sum of the moving distances of light is measured as d2, and the energy level may have a distribution of the lowest energy level value of about 0 to the highest energy level value of about 30. The embodiment of FIGS. 11A and 11B may form a relatively short light spreading distance and may have a relatively low energy level compared to the embodiment of FIGS. 10A and 10B. That is, the light passing through a transmissive area (the first area 201) in which the transparent wires 230 each having hemispherical irregularities 231 formed on one surface thereof are disposed may spread less and may have a lower energy compared to light passing through transparent wires each having a flat surface. Furthermore, in the display including the transparent wires having the irregularities 231 according to the embodiment of FIGS. 11A and 11B, the frequency of observation of flare may be reduced or relatively small flare may be observed compared to the embodiment of FIGS. 10A and 10B.

For example, when the hemispherical irregularities 231 are provided on one surface of each transparent wires 230, assuming that the radius of the transparent wires 230 is R(A) and the width of the transparent wires is W(A), flare may be effectively reduced when Conditional Expression 3 below is satisfied.

$$0.09 \leq R(A)/W(A) \leq 0.34 \quad \text{[CONDITIONAL EXPRESSION 3]}$$

In this case, the radius of the transparent wires may be about 0.3 μm≤R(A)≤1.5 μm.

For example, when the radius R(A) of the transparent wires 230 is about 0.3 μm to 1.5 μm, the width W(A) of the transparent wires 230 including the irregularities 231 is approximately 3.3 μm to 4.5 μm, it is possible to effectively reduce flare in a state in which transparency that makes the transparent wires 230 invisible from the outside is secured.

Figure 12A:
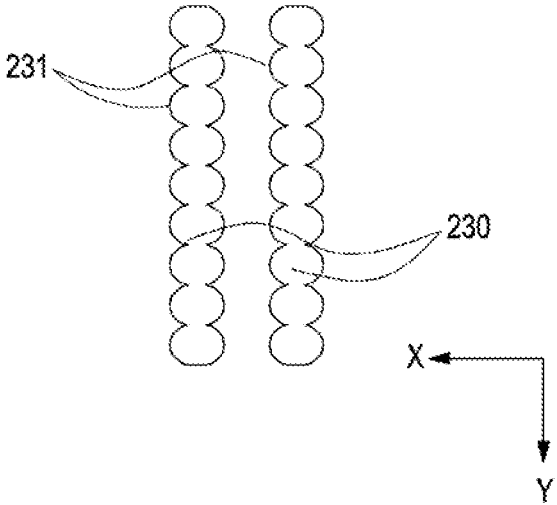
FIG. 12A is a view illustrating transparent wires according to an embodiment of the disclosure.
Figure 12B:
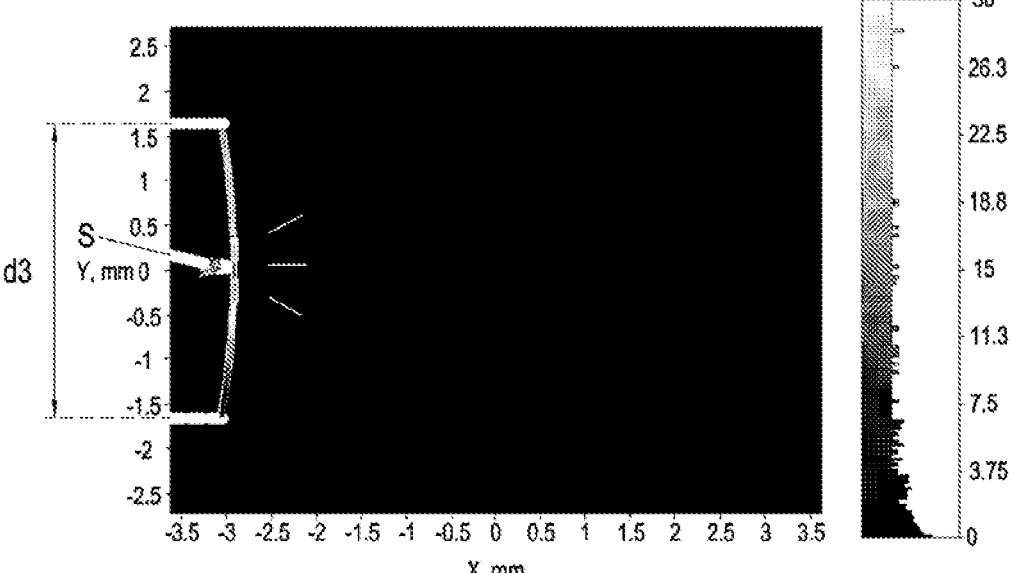
FIG. 12B is a view representing a photon irradiance of the embodiment of FIG. 12A.

FIG. 12A is a view illustrating transparent wires 230 according to an embodiment of the disclosure. FIG. 12B is a view representing a photon irradiance of the embodiment of FIG. 12A.

Referring to FIG. 12A, transparent wires 230 according to an embodiment may each include irregularities 231 provided on both surfaces thereof (e.g., the surface 230a oriented the third direction and the surface 230b oriented in a direction the opposite of the third direction), as illustrated in the drawing. At this time, the irregularities 231 provided on one surface of each transparent wire 230 and the irregularities 231 provided on the other surface of each transparent wire 230 may have a hemispherical shape, and may be bilaterally symmetrical to each other with reference to the transparent wire 230. According to the embodiment illustrated in FIGS. 12A and 12B, the sum of the moving distances of light is measured as d3, and the energy level may have a distribution of the lowest energy level value of about 0 to the highest energy level value of about 30. The embodiment of FIGS. 12A and 12B may form a relatively short light spreading distance and may have a relatively low energy level compared to the embodiment of FIGS. 10A and 10B. That is, the light passing through a transmissive area (the first area 201) in which the transparent wires 230 each having hemispherical irregularities 231 formed on both surfaces thereof are disposed may spread less and may have a lower energy compared to light passing through transparent wires each having a flat surface. Furthermore, in the display including the transparent wires having the irregularities 231 according to the embodiment of FIGS. 12A and 12B, the frequency of observation of flare may be remarkably reduced or remarkably small flare may be observed compared to the embodiment of FIGS. 10A and 10B.

For example, when the hemispherical irregularities 231 are provided on both surface of each transparent wires 230, assuming that the radius of the transparent wires 230 is R(A) and the width of the transparent wires is W(A), flare may be effectively reduced when Conditional Expression 4 below is satisfied.

$$0.08 \leq R(A)/W(A) \leq 0.25 \quad \text{[CONDITIONAL EXPRESSION 4]}$$

For example, when the radius of the transparent wires is about 0.3 μm≤R(A)≤1.5 μm, and the width W(A) of the transparent wires 230 including the irregularities 231 is about 3.7 μm to 6 μm, it is possible to effectively reduce flare in a state in which transparency that makes the transparent wires 230 invisible from the outside is secured.

Figure 13A:
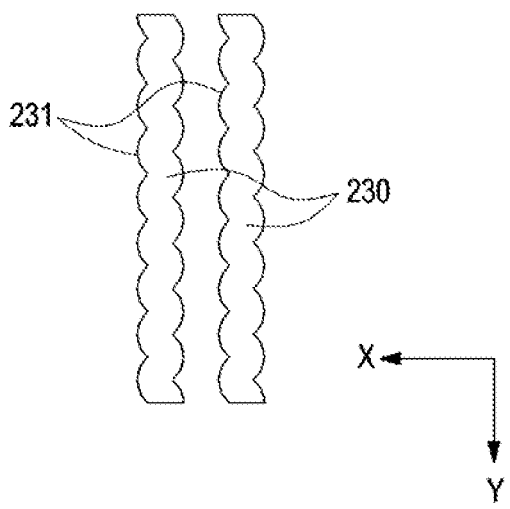
FIG. 13A is a view illustrating transparent wires according to an embodiment of the disclosure.
Figure 13B:
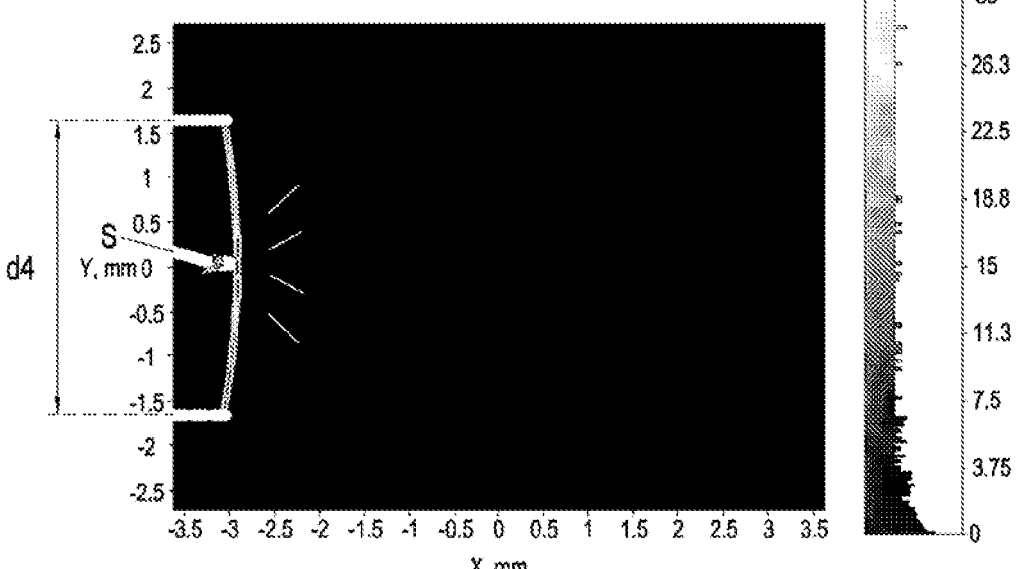
FIG. 13B is a view representing a photon irradiance of the embodiment of FIG. 13A.

FIG. 13A is a view illustrating transparent wires 230 according to another embodiment of the disclosure. FIG. 13B is a view representing a photon irradiance of the embodiment of FIG. 13A.

Referring to FIG. 13A, transparent wires 230 according to another embodiment may each include irregularities 231 provided on both surfaces thereof (e.g., the surface 230a oriented the third direction and the surface 230b oriented in a direction the opposite of the third direction), as illustrated in the drawing. However, in this case, the irregularities 231 provided on one surface of each transparent wire 230 and the irregularities 231 provided on the other surface of the transparent wire 230 may be asymmetrical to each other. Referring to FIG. 13B, it is possible to confirm that the sum d4 of the moving distances of light in FIG. 13B is shorter than the sum d1 of the moving distances of light in FIG. 10B. In addition, it is possible to confirm that the energy level of FIG. 13B has a distribution of the lowest energy level value of about 0 to the highest energy level value of about 30, and thus has a lower energy level than that in the embodiment of FIG. 10B.

As illustrated in FIGS. 11A to 13A, in the disclosure, by providing irregularity in at least a portion of the transparent wires 230, light passing through a transmissive area (the first area 201) is scattered (or propagation paths of light are changed), whereby it is possible to improve image quality.

According to various embodiments, the portions of the transparent wires 230 in which the irregularities 231 are provided may be limited to the portions corresponding to a portion where an under display camera (UDC) is disposed in the display panel. In order to enjoy the effects according to the above-described embodiments, the surfaces of the transparent wires 230 on which irregularities are provided may be limited in position. For example, when the irregularities 231 are provided on the surface of each transparent wire 230 oriented in the first direction (e.g., the Z-axis direction in FIG. 7) or in a direction opposite to the first direction, light may not be scattered to the extent that light spreading can be reduced. In contrast to this, only when the irregularities 231 are provided on the surface 230a of the transparent wires 230 that is oriented in the third direction (the X direction), light may be scattered to the extent that light spreading can be reduced, and it is possible to enjoy the effects according to the above-described embodiments.

The electronic device according to various embodiments disclosed herein may be any one of various types of electronic devices. The electronic devices may include, for example, a portable communication device (e.g., a smart phone), a computer device, a portable multimedia device, a portable medical device, a camera, a wearable device, or a home appliance. The electronic device according to embodiments of the disclosure is not limited to those described above.

It should be appreciated that various embodiments of the disclosure and the terms used therein are not intended to limit the technological features set forth herein to particular embodiments and include various changes, equivalents, or alternatives for a corresponding embodiment. With regard to the description of the drawings, similar reference numerals may be used to designate similar or relevant elements. A singular form of a noun corresponding to an item may include one or more of the items, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with/to" or "connected with/to" another element (e.g., a second element), it means that the element may be coupled/connected with/to the other element directly (e.g., wiredly), wirelessly, or via a third element.

As used herein, the term "module" may include a unit implemented in hardware, software, or firmware, and may be interchangeably used with other terms, for example, "logic," "logic block," "component," or "circuit". The "module" may be a minimum unit of a single integrated component adapted to perform one or more functions, or a part thereof. For example, according to an embodiment, the "module" may be implemented in the form of an application-specific integrated circuit (ASIC).

Various embodiments as set forth herein may be implemented as software (e.g., a program) including one or more instructions that are stored in a storage medium (e.g., an internal memory or external memory) that is readable by a machine (e.g., an electronic device). For example, a processor of the machine (e.g., the electronic device 100) may invoke at least one of the one or more stored instructions from the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each element (e.g., a module or a program) of the above-described elements may include a single entity or multiple entities. According to various embodiments, one or more of the above-described elements may be omitted, or one or more other elements may be added. Alternatively or additionally, a plurality of elements (e.g., modules or programs) may be integrated into a single element. In such a case, according to various embodiments, the integrated element may still perform one or more functions of each of the plurality of elements in the same or similar manner as they are performed by a corresponding one of the plurality of elements before the integration. According to various embodiments, operations performed by the module, the program, or another element may be carried out sequentially, in parallel, repeatedly, or heuristically, or one or more of the operations may be executed in a different order or omitted, or one or more other operations may be added.

Various embodiments of the disclosure may provide an electronic device (e.g., the electronic device 101 in FIG. 1) including: an optical lens module (e.g., the optical lens module 105 in FIG. 1); and a display (e.g., the display 101 in FIG. 4) including a pixel layer (e.g., the pixel layer 101-1) including a first area (e.g., the first area 201 in FIG. 4) corresponding to the angle of view of the optical lens module and a second area (e.g., the second area 202 in FIG. 4) disposed around the first area, and a wiring layer (e.g., the wiring layer 101-2 in FIG. 4), wherein the wiring layer includes: a transparent wire (e.g., the transparent wire 230 in FIG. 7) having a first refractive index; a first material (e.g., the first material 240 in FIG. 7) provided adjacent to the transparent wire and having a second refractive index; and a second material (e.g., the second material 250 in FIG. 7) laminated or stacked with the first material and has a third refractive index.

According to various embodiments, the optical lens module may be an under display camera (UDC) disposed under an active area of the display.

According to various embodiments, in the pixel layer, a plurality of pixels may be disposed in the first area at a first interval, and a plurality of pixels may be disposed in the second area at a second interval that is smaller than the first interval.

According to various embodiments, the wiring layer may satisfy Conditional Expression 1 below.

$$-0.045 \le (N(A)*T(A)-N(B)*T(B)-N(B')*T(B'))/(T(A)+T(B)+T(B')) \le 0.045 \quad \text{[CONDITIONAL EXPRESSION 1]}$$

(wherein N(A) is the first refractive index of the transparent wires, N(B) is the second refractive index of the first material, N(B') is the third refractive index of the second material, T(A) is a thickness of the transparent wires, T(B) is a thickness of the first material, and T(B') is a thickness of the second material).

According to various embodiments, the Conditional Expression 1 may be satisfied in, for example, a band of 435 nm to 656 nm.

According to various embodiments, the wiring layer may satisfy Condition Expression 2 below.

$$T(A)=T(B)+T(B') \quad \text{[CONDITIONAL EXPRESSION 2]}$$

(wherein T(A) is the thickness of the transparent wires, T(B) is the thickness of the first material, and T(B') is the thickness of the second material).

According to various embodiments, the transparent wires may be made of indium tin oxide (ITO).

According to various embodiments, the first material and the second material may be formed of a non-conductive material.

According to various embodiments, the first layer may be $SiN_x$.

According to various embodiments, the wiring layer may at least partially overlap the pixels of the display in a first direction, and the transparent wires may be provided to be elongated in a second direction perpendicular to the first direction.

According to various embodiments, the first material may be provided in parallel with the transparent wires in a third direction perpendicular to the first direction and the second direction.

According to various embodiments, the second material may be laminated or stacked with the first material in the first direction (e.g., the Z-axis direction in FIG. 7), and may be provided in parallel with the transparent wires in the third direction (e.g., the X-axis direction) perpendicular to the first direction and the second direction (e.g., the Y-axis direction in FIG. 3). Here, the first material, the second material, and the transparent wiring may each be elongated in the second direction (e.g., the Y-axis direction in FIG. 3).

According to various embodiments, the transparent wires may include irregularities provided on surfaces thereof.

According to various embodiments, the irregularities may be provided on one surface of each of the transparent wires.

According to various embodiments, the irregularities may be provided on the one surface of each of the transparent wires and the another surface that is opposite to the one surface.

According to various embodiments, the irregularities may be asymmetrically provided on the one surface of each of the transparent wires and the another surface that is opposite to the one surface.

Various embodiments of the disclosure may provide an electronic device (e.g., the electronic device 101 of FIG. 1) including: an optical lens module; and a display (e.g., the display 101 in FIG. 4) including a first area (e.g., the first area 201 in FIG. 4) corresponding to the angle of view of the optical lens module and a second area (e.g., the second area 202 in FIG. 4) disposed around the first area, wherein a plurality of pixels are disposed in the first area at a first interval, and a plurality of pixels are disposed in the second area at a second interval that is smaller than the first interval; and a wiring layer (e.g., the wiring layer 101-2 in FIG. 4) in which a plurality of transparent wires are disposed side by side, wherein the optical lens module is configured as an under display camera (UDC) disposed under an active area of the display), and the plurality of transparent wires are each provided with irregularities (e.g., the irregularities 231 in FIGS. 11A, 12A, and 13A) having a predetermined thickness on at least one side toward wires adjacent thereto.

According to various embodiments, the electronic device may further include: a first material (e.g., the first material 240 in FIG. 7) provided adjacent to the plurality of transparent wires; and a second material (e.g., the second material 250 in FIG. 7) configuring a laminated or stacked structure with the first material.

According to various embodiments, the irregularities may be provided on one surface of each of the transparent wires (see FIG. 11A). Here, the one surface may be one of a surface oriented in a third direction (e.g., the X-axis direction) or a surface oriented in a direction opposite to the third direction when the transparent wires are viewed from above.

According to various embodiments, the irregularities may be provided on the one surface of each of the transparent wires and the another surface that is opposite to the one surface (see FIG. 12A).

According to various embodiments, the irregularities may be asymmetrically provided on the one surface of each of the transparent wires and the another surface that is opposite to the one surface (see FIG. 13A).

Various embodiments of the disclosure may provide an electronic device including: a display panel; and an under display camera (UDC) under the display panel, wherein the display panel comprises a plurality of pixels, wherein a first pixel density in a first region of the display panel is lower than a second pixel density in a second region of the display panel, and wherein the UDC is positioned under the second region of the display panel.

According to various embodiments, wherein the display panel further comprises a plurality of transparent wires under the plurality of pixels.

According to various embodiments, wherein the display panel further comprises a first material between adjacent transparent wires from among the plurality of transparent wires.

According to various embodiments, wherein the display panel further comprises a second material between the adjacent transparent wires from among the plurality of transparent wires, and wherein the second material is stacked with the first material.

According to various embodiments, wherein each transparent wire from among the plurality of transparent wires extends in a first direction and comprises a plurality of hemispherical protrusions that protrude from a side of the transparent wire in a second direction perpendicular to the first direction.

The electronic device according to various embodiments of the disclosure as described above is not limited by the above-described embodiments and the drawings, and it will be apparent to those skilled in the art that various alternatives, changes, and modifications may be made thereto within the technical scope of the disclosure.

What is claimed is:

1. An electronic device comprising:
an optical lens module comprising a plurality of lenses; and
a display comprising a pixel layer and a wiring layer,
wherein the pixel layer comprises:
   a first area corresponding to an angle of view of the optical lens module; and
   a second area around the first area, and
wherein the wiring layer comprises:
   a transparent wire having a first refractive index;
   a first material provided adjacent to the transparent wire and having a second refractive index; and
   a second material having a third refractive index, wherein the first material is disposed on the second material or the second material is disposed on the first material,
wherein a first surface of the transparent wire has irregularities provided thereon.

2. The electronic device of claim 1, wherein the optical lens module comprises an under display camera (UDC) provided under an active area of the display.

3. The electronic device of claim 2, wherein the first area of the pixel layer comprises a first plurality of pixels provided at a first interval, and
the second area of the pixel layer comprises a second plurality of pixels provided at a second interval that is smaller than the first interval.

4. The electronic device of claim 1, wherein the wiring layer satisfies the expression:

$$-0.045 \leq (N(A)*T(A) - N(B)*T(B) - N(B')*T(B'))/(T(A)+T(B)+T(B')) \leq 0.045,$$

where N(A) is the first refractive index of the transparent wire,

N(B) is the second refractive index of the first material,
N(B') is the third refractive index of the second material,
T(A) is a thickness of the transparent wire,
T(B) is a thickness of the first material, and
T(B') is a thickness of the second material.

5. The electronic device of claim 4, wherein the wiring layer satisfies the expression:

$$T(A)=T(B)+T(B').$$

6. The electronic device of claim 1, wherein the transparent wire comprises indium tin oxide (ITO).

7. The electronic device of claim 1, wherein each of the first material and the second material comprises a non-conductive material.

8. The electronic device of claim 7, wherein the first material comprises $SiN_x$.

9. The electronic device of claim 1, wherein the wiring layer at least partially overlaps pixels of the display in a first direction, and wherein the transparent wire is elongated in a second direction perpendicular to the first direction.

10. The electronic device of claim 9, wherein the first material is adjacent to the transparent wire in a third direction perpendicular to the first direction and the second direction.

11. The electronic device of claim 10, wherein the first material and the second material are adjacent to each other in the first direction, and the second material is adjacent to the transparent wire in the third direction.

12. The electronic device of claim 1, wherein the irregularities are provided on only the first surface of the transparent wire.

13. The electronic device of claim 1, wherein a second surface of the transparent wire that is opposite to the first surface has the irregularities provided thereon.

14. The electronic device of claim 13, wherein the irregularities are asymmetrically provided on the first and second surfaces of the transparent wire.

15. An electronic device comprising:
an optical lens module comprising a plurality of lenses;
a display comprising a first area corresponding to an angle of view of the optical lens module and a second area around the first area, wherein the first area comprises a first plurality of pixels provided at a first interval, and the second area comprises a second plurality of pixels provided at a second interval that is smaller than the first interval; and
a wiring layer comprising a plurality of transparent wires are arranged side by side,
wherein the optical lens module is provided under an active area of the display, and
wherein each transparent wire of the plurality of transparent wires comprises irregularities having a predetermined thickness on at least one side of the transparent wire facing other adjacent transparent wires among the plurality of transparent wires.

16. The electronic device of claim 15, further comprising:
a plurality of first materials provided adjacent to the plurality of transparent wires; and
a plurality of second materials provided adjacent to the plurality of transparent wires,
wherein the plurality of first materials are disposed on the plurality of second materials or the plurality of second materials are disposed on the plurality of first materials.

17. The electronic device of claim 15, wherein the irregularities are provided on only one surface of each transparent wire among the plurality of transparent wires.

18. The electronic device of claim 15, wherein the irregularities are provided on a first surface of each transparent wire of the plurality of transparent wires and on a second surface of each transparent wire of the plurality of transparent wires that is opposite to the first surface.

19. The electronic device of claim 18, wherein the irregularities are asymmetrically provided on the first and second surfaces of each of the plurality of transparent wires.

* * * * *